(12) United States Patent
Park et al.

(10) Patent No.: US 7,515,476 B2
(45) Date of Patent: Apr. 7, 2009

(54) NON-VOLATILE MEMORY DEVICE AND DATA READ METHOD AND PROGRAM VERIFY METHOD OF NON-VOLATILE MEMORY DEVICE

(75) Inventors: Seong Hun Park, Gunsan-si (KR); Duck Ju Kim, Icheon-si (KR); Chang Won Yang, Icheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/751,016

(22) Filed: May 19, 2007

(65) Prior Publication Data
US 2008/0158987 A1    Jul. 3, 2008

(30) Foreign Application Priority Data
Dec. 27, 2006   (KR) ...................... 10-2006-0134942

(51) Int. Cl.
*G11C 16/06* (2006.01)
(52) U.S. Cl. ............................ 365/185.25; 365/185.17; 365/185.18
(58) Field of Classification Search ............ 365/185.17, 365/185.18, 185.21, 185.22, 185.23
See application file for complete search history.

(56) References Cited

U.S. PATENT DOCUMENTS 6,072,719 A * 6/2000 Tanzawa et al. ........ 365/185.03
6,154,403 A * 11/2000 Tanzawa et al. ............. 365/203
7,269,064 B2 * 9/2007 Kim ....................... 365/185.12
7,366,014 B2 * 4/2008 Micheloni et al. ...... 365/185.03

FOREIGN PATENT DOCUMENTS

KR  1020060016553 A   2/2006
KR  1020060060386 A   6/2006

* cited by examiner

*Primary Examiner*—Gene N. Auduong
(74) *Attorney, Agent, or Firm*—Townsend and Townsend and Crew LLP

(57) ABSTRACT

A non-volatile memory device includes an even bit line and an odd bit line, a first register, a second register, a first precharge unit, a second precharge unit and a bit line select unit. The even bit line and the odd bit line are connected to a memory cell array. The first register is connected to the even bit line and configured to store specific data. The second register is connected to the odd bit line and configured to store specific data. The first precharge unit precharges an even sense node, formed at a node of the even bit line and the first register, with a high level or supplies supplementary current to the even sense node. The second precharge unit precharges an odd sense node, formed at a node of the odd bit line and the second register, with a high level or supplies supplementary current to the odd sense node. The bit line select unit connects the even bit line and the even sense node and connects the odd bit line and the odd sense node.

16 Claims, 3 Drawing Sheets

NON-VOLATILE MEMORY DEVICE AND DATA READ METHOD AND PROGRAM VERIFY METHOD OF NON-VOLATILE MEMORY DEVICE

CROSS-REFERENCES TO RELATED APPLICATIONS

The present application claims priority to Korean patent application number 10-2006-134942, filed on Dec. 27, 2006, which is incorporated by reference in its entirety.

BACKGROUND OF THE INVENTION

The present invention relates to non-volatile memory devices and, more particularly, to a data read method and a program verify method of the non-volatile memory device, in which the influence of coupling is not exerted between bit lines.

A conventional non-volatile memory device employs a method of performing a program operation and a program verify operation on even bit lines and odd bit lines through one sense node, which means each bit line has to be programmed and verified one at a time.

Furthermore, in the sensing period of the read or verify process, the bit line is generally kept floating. In the case where a word line including a programmed cell and an erased cell in two neighboring bit lines is selected, the two bit lines influence each other by coupling capacitance. Thus, a different value from the stored data can be output as a result of the read operation. Furthermore, as a multi-level cell technique for storing several bits in one cell has recently been applied, the states represented by one cell are increased. Accordingly, the distance between threshold voltages, which divides the states of a cell, is significantly reduced. Thus, there is a high possibility that malfunction may occur because of coupling between bit lines.

SUMMARY OF THE INVENTION

The present invention is a non-volatile memory device including a page buffer, in which a data storage register is connected to every bit line.

The present invention further discloses a data read method and a program verify method of the non-volatile memory device, in which an even bit line and an odd bit line are precharged at the same time, and the level of a bit line is evaluated.

In an aspect, a non-volatile memory device includes an even bit line and an odd bit line, a first register, a second register, a first precharge unit, a second precharge unit and a bit line select unit. The even bit line and the odd bit line are connected to a memory cell array. The first register is connected to the even bit line and configured to store specific data. The second register is connected to the odd bit line and configured to store specific data. The first precharge unit precharges an even sense node, formed at a node of the even bit line and the first register, with a high level or supplies supplementary current to the even sense node. The second precharge unit precharges an odd sense node, formed at a node of the odd bit line and the second register, with a high level or supplies supplementary current to the odd sense node. The bit line select unit connects the even bit line and the even sense node and connects the odd bit line and the odd sense node.

In another aspect, a data read method of a non-volatile memory device includes the steps of providing a non-volatile memory device including a second precharge unit for precharging an even sense node, formed at a node of an even bit line and a first register, with a high level or supplying supplementary current to the even sense node, and a second precharge unit for precharging an odd sense node, formed at a node of an odd bit line and a second register, with a high level or supplying supplementary current to the odd sense node; allowing the first precharge unit and the second precharge unit to precharge the even sense node and the odd sense node with a high level; applying a bit line select signal of a high level to connect the even bit line and the even sense node, and the odd bit line and the odd sense node at the same time; turning on a drain select transistor to connect a cell string, including a specific memory cell to be read, and each of the bit lines; applying voltage of a low level to a word line connected to the specific memory cell, and applying voltage of a high level to the remaining word lines; turning on a source select transistor to connect one terminal of the cell string to a common source line connected to ground voltage; allowing the first precharge unit and the second precharge unit to supply supplementary current to the even sense node and the odd sense node; and evaluating whether the memory cell to be read has been programmed depending on variation in a voltage level of each of the bit lines, and applying a read signal so that a voltage level of a specific cell is applied to the first register and the second register, respectively.

In further another aspect, a program verify method of a non-volatile memory device includes the steps of providing a non-volatile memory device including a second precharge unit for precharging an even sense node, formed at a node of an even bit line and a first register, with a high level or supplying supplementary current to the even sense node, and a second precharge unit for precharging an odd sense node, formed at a node of an odd bit line and a second register, with a high level or supplying supplementary current to the odd sense node; allowing the first precharge unit and the second precharge unit to precharge the even sense node and the odd sense node with a high level; applying a bit line select signal of a high level to connect the even bit line and the even sense node, and the odd bit line and the odd sense node at the same time; turning on a drain select transistor to connect a cell string, including a specific memory cell to be read, and each of the bit lines; applying a verify reference voltage to a word line connected to the specific memory cell, and applying voltage of a high level to the remaining word lines; turning on a source select transistor to connect one terminal of the cell string to a common source line connected to ground voltage; allowing the first precharge unit and the second precharge unit to supply supplementary current to the even sense node and the odd sense node; and evaluating whether the memory cell to be read has been programmed depending on variation in a voltage level of each of the bit lines, and applying a read signal so that a voltage level of a specific cell is applied to the first register and the second register, respectively.

DESCRIPTION OF SPECIFIC EMBODIMENTS

A specific embodiment according to the present patent will be described with reference to the accompanying drawings.

Figure 1:
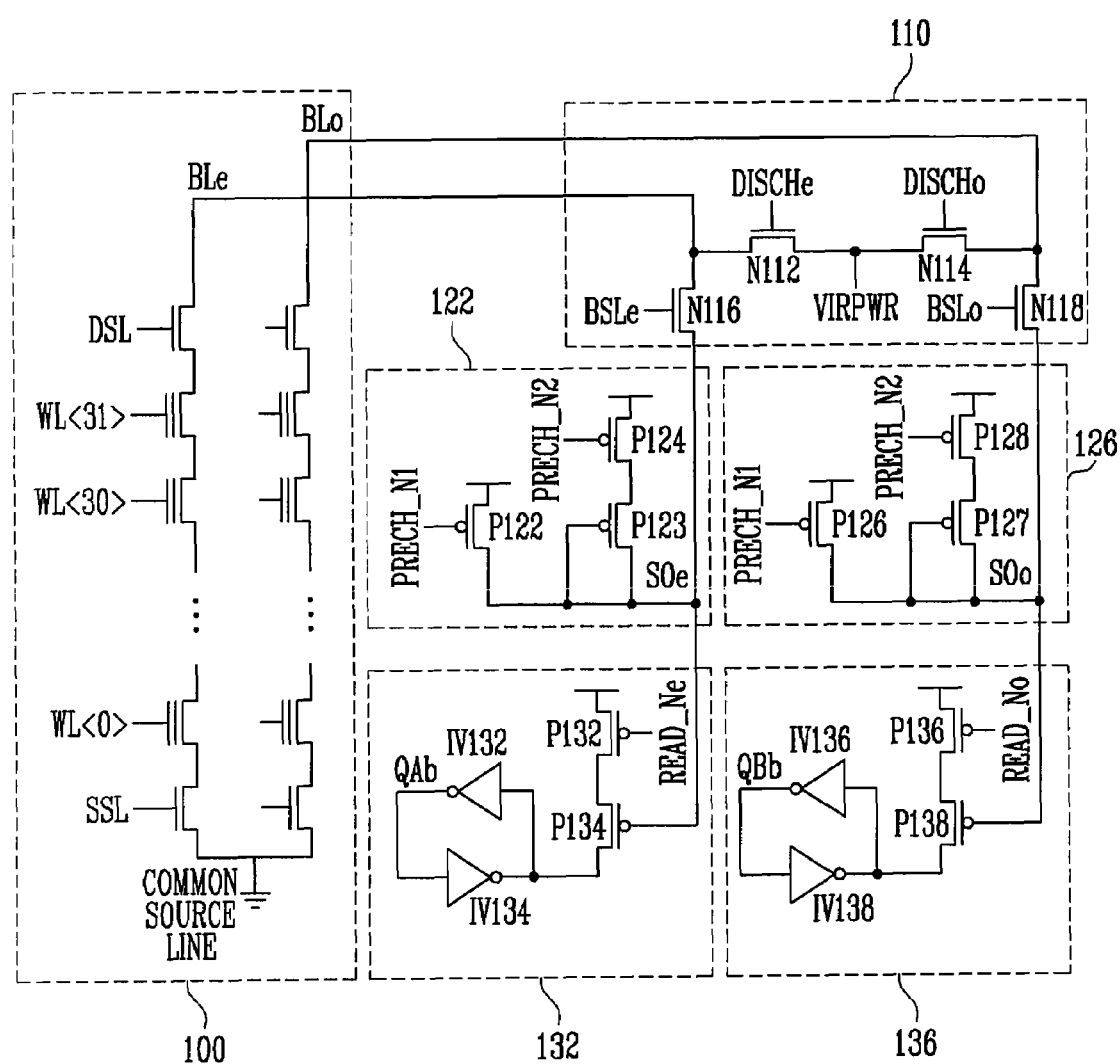
FIG. 1 is a circuit diagram of a non-volatile memory device according to an embodiment of the present invention.

FIG. 1 is a circuit diagram of a non-volatile memory device according to an embodiment of the present invention.

The non-volatile memory device of the present embodiment includes a page buffer. The page buffer includes a memory cell array 100, a select unit 110, a first precharge unit 122, a second precharge unit 126, a first register 132, and a second register 136. The memory cell array 100 is connected to the first and second registers 132, 136 through bit lines BLe, BLo, select unit 110, and sense nodes SOe, SOo. The registers 132, 136 temporarily store read or program data from/to the memory cell array 100. The select unit 110 respectively connects the even lit line BLe and odd bit line BLo to the sense nodes SOe and SOo according to bit line select signals BSLe and BSLo. The precharge units 122, 126 precharge or supply a supplementary current to the even sense node SOe and odd sense node SOo, respectively.

The memory cell array 100 includes memory cells for storing data, word lines for selecting and activating the memory cells, and the bit lines BLe and BLo for inputting and outputting the data of the memory cell. The memory cell array 100 has a structure in which the plurality of word lines and the plurality of bit lines are arranged in matrix form. The memory cells are serially connected (e.g., string structure) between source select transistors SSL and drain select transistors DSL. The gates of the memory cells are connected to the word line. A collection of memory cells connected to the same word line, is referred to as a "page". Each string is connected to one bit line. The opposite end of the plurality of strings is connected to a common source line in parallel, forming a block.

The bit line select unit 110 includes NMOS transistors N112 and N114 for supplying a control signal VIRPWR to the bit line BLe or BLo in response to discharge signals DISCHe and DISCHo. The bit line select unit 110 further includes NMOS transistors N116 and N118 for connecting the bit lines BLe and BLo and the sense nodes SOe and SOo, respectively, in response to the bit line select signals BSLe and BSLo.

The first precharge unit 122 includes a first PMOS transistor P122 for applying a power supply voltage to the even sense node SOe in response to a first precharge signal PRECH_N1=low, a second PMOS transistor P124 for applying the supplementary current to the even sense node SOe in response to a second precharge signal PRECH_N2=low, and a third PMOS transistor P123 connected between the drain of the second PMOS transistor P124 and the even sense node SOe and configured to prevent the counterflow of current passing through the second PMOS transistor P124. The third PMOS transistor P123 is diode-connected. In this case, even when the second precharge signal PRECH_N2=low, only the current is supplied by the third PMOS transistor P123, but the voltage level of the even sense node SOe is not influenced.

The second precharge unit 126 includes a fourth PMOS transistor P126 for applying a power supply voltage to the odd sense node SOo in response to the first precharge signal PRECH_N1=low, a fifth PMOS transistor P128 for applying supplementary current to the odd sense node SOo in response to the second precharge signal PRECH_N2=low, and a sixth PMOS transistor P127 connected between the drain of the fifth PMOS transistor P128 and the odd sense node SOo and configured to prevent the counterflow of current passing through the fifth PMOS transistor P128. In a similar way, even when the second precharge signal PRECH_N2=low, only the current is supplied by the sixth PMOS transistor P127, but the voltage level of the odd sense node SOo is not influenced.

The first register 132 includes a latch having two inverters IV132 and IV134, a PMOS transistor P134 connected to a first node QA of the latch and turned on in response to a voltage level of the even sense node SOe, and a PMOS transistor P132 connected between the PMOS transistor P134 and the power supply voltage and turned on in response to a first control signal READ_Ne.

The second register 136 includes a latch having two inverters IV136 and IV138, a PMOS transistor P136 connected to a first node QB of the latch and turned on in response to a voltage level of the odd sense node SOo, and a PMOS transistor P136 connected between the PMOS transistor P136 and the power supply voltage turned on in response to a second control signal READ_No.

A data read operation of the non-volatile memory device according to an embodiment of the present invention is described with reference to FIG. 2.

(1) Period T1

Before a specific bit line is precharged, the discharge signals DISCHe and DISCHo are set high and applied to the gates of the NMOS transistors N112 and N114. These transistors are connected between an input terminal of a control signal and each bit line, connecting a pair of the even and odd bit lines and the input terminal of the control signal. Therefore, the control signal VIRPWR, serving as a bias voltage, is applied to each of the bit lines BLe and BLo. In this case, the control signal VIRPWR is kept at a low level. Accordingly, each of the bit lines BLe and BLo is discharged by the control signal VIRPWR=0V.

Further, the first precharge signal PRECH_N1 is set low to turn on the PMOS transistors P122 and P126 at the same time, so that each of the sense nodes SOe and SOo is precharged. As described above, each of the bit lines BLe and BLo is discharged and each of the sense nodes SOe and SOo is precharged, thus completing an initial setting.

Meanwhile, a logic 0 value is initially stored in the first nodes QA and QB of each register.

(2) Period T2

The bit line select signals BSLe and BSLo are set high (Vcc+Vth) to simultaneously turn on the NMOS transistors N116 and N118. Therefore, each of the bit lines BLe and BLo and each of the sense node SOe and SOo are connected, so that each of the bit lines BLe and BLo is precharged with Vcc.

The drain select transistor DSL is turned on to connect a cell string, including a specific memory cell to be read, and the bit lines BLe and BLo.

Further, 0V is applied to a selected word line, that is, a word line connected to a specific memory cell, and voltage Vread of a specific level is applied to the remaining unselected word lines.

Further, the source select transistor SSL is turned on to connect one terminal of the cell string to the common source line connected to ground voltage. Thus, one end of the cell string is connected to the bit line, and the other end of the cell string is connected to the common source line, so that a current path reaching from the sense node to the common source line via the bit line is established.

(3) Period T3

The second precharge signal PRECH_N2, goes low to turn on the PMOS transistors P124 and P128. At the end of Period T3, the first precharge signal PRECH_N1, goes high to turn off the PMOS transistors P122 and P126.

The first precharge signal PRECH_N1 functions to precharge each sense node and the bit lines in the previous periods T1 and T2.

Further, the second precharge signal PRECH_N2 supplies supplementary current to each of the bit lines BLe and BLo in a period T4 where the level of a bit line is evaluated and the voltage level of the sense node is sensed, and functions to prevent a floating bit line. Accordingly, current can flow through a specific cell connected to an even bit line and a specific cell, connected to an odd bit line adjacent to the even bit line, even in the sensing period. It is therefore possible to prevent malfunction caused by coupling between neighboring bit lines.

(4) Period T4

An evaluation step of determining whether a specific cell has been programmed depending on the degree of change of the voltage level of each of the bit lines BLe and BLo is performed. After a specific period of time elapses, whether a specific cell will be programmed depending on the voltage level of each of the sense nodes SOe and SOo is stored in each of the registers 132 and 136.

In the evaluation step, in the case where a selected cell is a programmed cell, the amount of current exiting the common source line is negligible, so that variation in the bit line voltage level is small. However, in the case where a selected cell is an erased cell, current supplied to the bit line exists the common source line, so that the bit line level is lowered. Consequently, whether a memory cell to be read will be programmed is varied depending on variation in the voltage level of a bit line.

In order to store whether a specific cell will be programmed depending on the voltage level of the sense node, first and second control signals READ_Ne, READ_No are applied to the PMOS transistors P132 and P136 of each of the registers 132 and 136 at the same time so that the power supply voltage can be applied to each of the registers 132 and 136 depending on the voltage level of the sense node.

Accordingly, in the case where a specific cell is programmed and variation in the voltage level of the sense node SOe or SOo is small, the PMOS transistor P134 or P138 of the register 132 or 136 is turned off, thus maintaining logic 0 data that is initially stored.

However, in the case where a specific cell is not programmed, the voltage level of the sense node SOe or SOo goes low. Therefore, the PMOS transistor P134 or P138 of the register 132 or 136 is turned on, so that logic 1 data is stored in the register 132 or 136.

Figure 2:
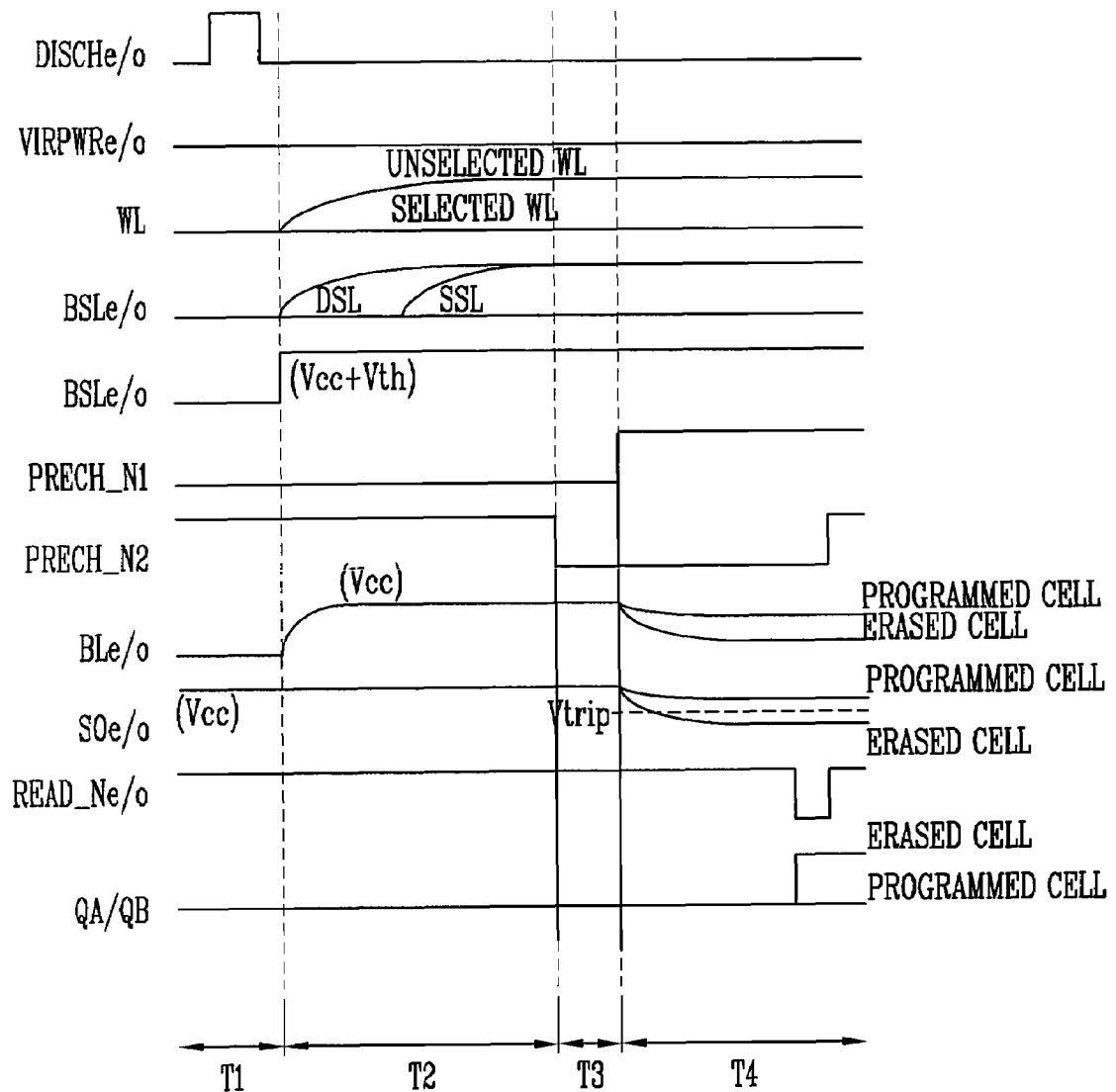
FIG. 2 is a waveform showing various voltage signals applied at the time of a data read operation of the non-volatile memory device according to an embodiment of the present invention.
Figure 3:
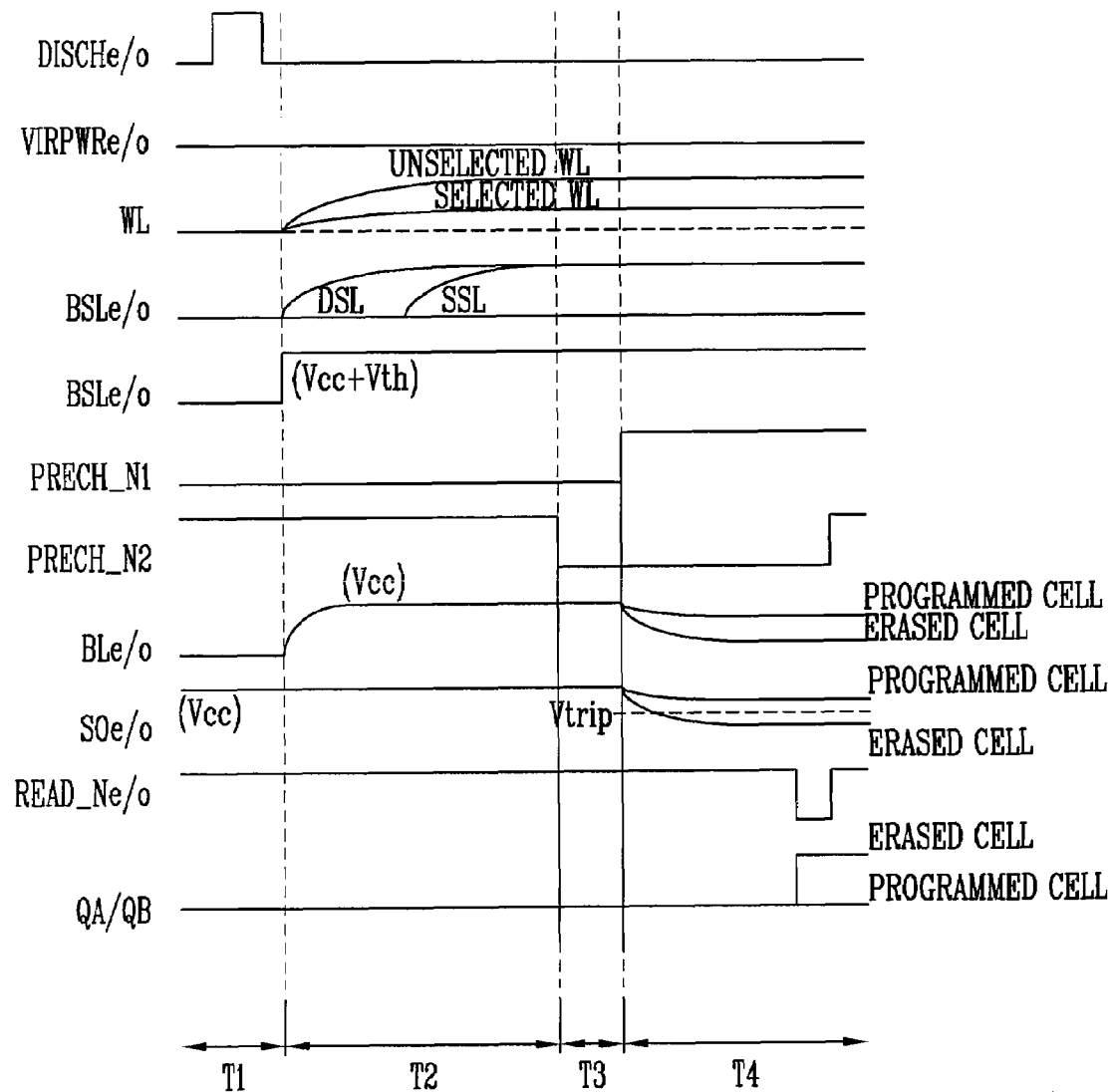
FIG. 3 is a waveform showing various voltage signals applied at the time of a program verify operation of the non-volatile memory device according to an embodiment of the present invention.

The waveforms of FIG. 3 showing the program verify operation is almost similar to that of FIG. 2 except that a verify reference voltage is applied to the selected word line in the period T2 unlike FIG. 2. This is because the program verify operation is performed in a similar manner to the data read operation.

(1) Period T1

An overall operation is the same as that of FIG. 2.

(2) Period T2

An overall operation is the same as that of FIG. 2 except for voltage applied to the word line.

A verify reference voltage is applied to a selected word line, that is, a word line connected to a specific memory cell in order to determine whether a corresponding cell has been programmed, and the voltage Vread of a specific level is applied to the remaining unselected word lines.

A construction in which the voltage level of the bit line is varied depending on whether a selected cell has been programmed is the same as that of FIG. 2.

(3) Periods T3 and T4

An overall operation is the same as that of FIG. 2.

As described above, according to the present invention, the data read or program verify operation is performed on an even bit line and an odd bit line at the same time. Accordingly, the data read or program verify rate can be doubled compared with a conventional method.

Further, since the data read or program verify operation is performed on an even bit line and an odd bit line at the same time, malfunction caused by coupling of neighboring bit lines, which occurs at the time of the data read or program verify operation on a specific bit line, can be prevented.

Although the foregoing description has been made with reference to the various embodiments, it is to be understood that changes and modifications of the present patent may be made by the ordinary skilled in the art without departing from the spirit and scope of the present patent and appended claims.

What is claimed is:

1. A non-volatile memory device, comprising:
   an even bit line and an odd bit line connected to a memory cell array;
   a first register coupled to the even bit line and configured to store data;
   a second register coupled to the odd bit line and configured to store data;
   a first precharge unit to precharge an even sense node with a high level or supplying supplementary current, the even sense node defined at a node associated with the even bit line and the first register;
   a second precharge unit to precharge an odd sense node with a high level or supplying supplementary current the odd sense node defined at a node associated with the odd bit line and the second register, wherein the odd sense node is electrically isolated from the even sense node; and
   a bit line select unit to connect the even bit line and the even sense node and connect the odd bit line and the odd sense node.

2. The non-volatile memory device of claim 1, wherein the bit Line select unit comprises:
   a first NMOS transistor to connect the even bit line and the even sense node in response to a first bit line select signal;
   a second NMOS transistor to connect the odd bit line and the odd sense node in response to a second bit line select signal.

3. The non-volatile memory device of claim 2, wherein the first bit line select signal and the second bit line select signal are applied at substantially the same time when the even bit line and the even sense node are connected and when the odd bit line and the odd sense node are connected.

4. The non-volatile memory device of claim 1, wherein the bit line select unit comprises:
   a control signal input terminal to apply a control signal of a specific level;
   a third NMOS transistor to connect the even bit line and the control signal input terminal in response to a first discharge signal; and
   a fourth NMOS transistor to connect the odd bit line and the control signal input terminal in response to a second discharge signal.

5. The non-volatile memory device of claim 4, wherein the first discharge signal and the second discharge signal are applied substantially at the same time when the even bit line and the control signal input terminal are connected and when the odd bit line and the control signal are connected.

6. The non-volatile memory device of claim 1, wherein the first precharge unit comprises:

a first PMOS transistor to apply a power supply voltage to the even sense node in response to a first precharge signal of a low level;

a second PMOS transistor to supply supplementary current to the even sense node in response to a second precharge signal of a low level; and a third PMOS transistor connected to a drain of the second PMOS transistor and the even sense node, and configured to prevent countercurrent of current passing through the second PMOS transistor, wherein the third PMOS transistor is diode-connected.

7. The non-volatile memory device of claim 1, wherein the second precharge unit comprises:

a fourth PMOS transistor to apply a power supply voltage to the odd sense node in response to a first precharge signal of a low level;

a fifth PMOS transistor to supply supplementary current to the odd sense node in response to a second precharge signal of a low level; and a sixth PMOS transistor connected to a drain of the fifth PMOS transistor and the even sense node, and configured to prevent countercurrent of current passing through the fifth PMOS transistor, wherein the sixth PMOS transistor is diode-connected.

8. A data read method for a non-volatile memory device, the method comprising:

providing a non-volatile memory device including a first precharge unit to precharge an even sense node with a high level or supplying supplementary current, the even sense node being defined at a node associated with an even bit line and a first register, and a second precharge unit to precharge an odd sense node with a high level or supplying supplementary current, the odd sense node being defined at a node associated with an odd bit line and a second register;

allowing the first precharge unit and the second precharge unit to precharge the even sense node and the odd sense node individually with a high level;

applying a bit line select signal of a high level to connect the even bit line and the even sense node, and the odd bit line and the odd sense node at substantially the same time;

turning on a drain select transistor to connect a cell string and each of the bit lines, the cell string including a memory cell to be read;

applying voltage of a low level to a word line connected to the specific memory cell, and applying voltage of a high level to the remaining word lines;

turning on a source select transistor to connect one terminal of the cell string to a common source line connected to ground voltage;

allowing the first precharge unit and the second precharge unit to supply supplementary current to the even sense node and the odd sense node; and evaluating whether the memory cell to be read has been programmed using variation in a voltage level of each of the bit lines, and applying a read signal so that a voltage level of a specific cell is applied to the first register and the second register, respectively.

9. The data read method of claim 8, the method further comprising:

applying a discharge signal of a high level to NMOS transistors connected between an input terminal of a control signal and a pair of the even bit line and the odd bit line at substantially the same time;

connecting each of the bit lines and the control signal input terminal before the precharge step is performed; and applying a specific voltage of a low level to the control signal input terminal to discharge each of the bit lines.

10. The data read method of claim 8, wherein the step of precharging the even sense node and the odd sense node with a high level comprises the step of applying a first precharge signal of a low level to a gate of a first PMOS transistor connected between a power supply voltage and each sense node such that each sense node is connected to the power supply voltage.

11. The data read method of claim 10, wherein the step of supplying the supplementary current to the even sense node and the odd sense node comprises:

applying a second precharge signal of a low level to a gate of a second PMOS transistor connected to power supply voltage, so that supplementary current is supplied from the power supply voltage through a third PMOS transistor connected between a drain of the second PMOS transistor and each sense node, the third PMOS transistor being diode-connected; and shifting the first precharge signal to a high level in order to stop the precharge of each sense node.

12. A program verify method of a non-volatile memory device, the method comprising:

providing a non-volatile memory device including a second precharge unit for precharging an even sense node with a high level or supplying supplementary current, the even sense node being defined at a node associated with an even bit line and a first register, and a second precharge unit for precharging an odd sense node with a high level or supplying supplementary current, the odd sense node being defined at a node associated with an odd bit line and a second register;

allowing the first precharge unit and the second precharge unit to precharge the even sense node and the odd sense node individually with a high level;

applying a bit line select signal of a high level to connect the even bit line and the even sense node, and the odd bit line and the odd sense node at the same time;

turning on a drain select transistor to connect a cell string and each of the bit lines, the cell string including a specific memory cell to be read;

applying a verify reference voltage to a word line connected to the specific memory cell, and applying voltage of a high level to the remaining word lines;

turning on a source select transistor to connect one terminal of the cell string to a common source line connected to ground voltage;

allowing the first precharge unit and the second precharge unit to supply supplementary current to the even sense node and the odd sense node; and evaluating whether the memory cell to be read has been programmed using variation in a voltage level of each of the bit lines, and applying a read signal so that a voltage level of a specific cell is applied to the first register and the second register, respectively.

13. The program verify method of claim 12, further comprising:

applying a discharge signal of a high level to NMOS transistors connected between an input terminal of a control signal and a pair of the even bit line and the odd bit line at substantially the same time;

connecting each of the bit lines and the control signal input terminal before the precharge step is performed; and applying a specific voltage of a low level to the control signal input terminal to discharge each of the bit lines.

14. The program verify method of claim 12, wherein the step of precharging the even sense node and the odd sense node with a high level comprises the step of applying a first precharge signal of a low level to a gate of a first PMOS transistor connected between a power supply voltage and each sense node such that each sense node is connected to the power supply voltage.

15. The program verify method of claim 14, wherein the step of supplying the supplementary current to the even sense node and the odd sense node comprises:

applying a second precharge signal of a low level to a gate of a second PMOS transistor connected to power supply voltage, so that supplementary current is supplied from the power supply voltage through a third PMOS transistor connected between a drain of the second PMOS transistor and each sense node, the third PMOS transistor being diode-connected; and shifting the first precharge signal to a high level in order to stop the precharge of each sense node.

16. A non-volatile memory device, comprising:

an even bit line and an odd bit line connected to a memory cell array;

a first register coupled to the even bit line and configured to store data;

a second register coupled to the odd bit line and configured to store data;

a first precharge unit configured to precharge an even sense node with a high level or to supply supplementary current, wherein the even sense node is defined at a node associated with the even bit line and the first register;

a second precharge unit configured to precharge an odd sense node with a high level or to supply supplementary current, wherein the odd sense node is defined at a node associated with the odd bit line and the second register; and a bit line select unit configured to couple the even bit line and the even sense node and to couple the odd bit line and the odd sense node.

* * * * *